US011004972B2

(12) United States Patent
Yu et al.

(10) Patent No.: US 11,004,972 B2
(45) Date of Patent: May 11, 2021

(54) SEMICONDUCTOR DEVICE HAVING CONDUCTING MEMBER FOR ELECTRICALLY COUPLING GATE STRUCTURE TO UNDERLYING SUBSTRATE OF SOI STRUCTURE

(71) Applicant: GLOBALFOUNDRIES Singapore Pte. Ltd., Singapore (SG)

(72) Inventors: Bo Yu, Singapore (SG); Shaoqiang Zhang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 27 days.

(21) Appl. No.: 16/438,574

(22) Filed: Jun. 12, 2019

(65) Prior Publication Data

US 2020/0395385 A1    Dec. 17, 2020

(51) Int. Cl.
*H01L 29/78* (2006.01)
*H01L 27/12* (2006.01)
(Continued)

(52) U.S. Cl.
CPC ...... *H01L 29/783* (2013.01); *H01L 21/76264* (2013.01); *H01L 21/76283* (2013.01);
(Continued)

(58) Field of Classification Search
CPC ......... H01L 21/76264; H01L 21/76283; H01L 21/76816; H01L 21/76877; H01L 21/823475; H01L 21/823481; H01L 23/5226; H01L 23/528; H01L 23/5283; H01L 29/0653; H01L 29/66568; H01L 29/66651; H01L 29/783; H01L 29/78651
See application file for complete search history.

(56) References Cited

U.S. PATENT DOCUMENTS 9,780,210 B1 * 10/2017 Goktepeli ......... H01L 21/76898
9,997,393 B1 *  6/2018 Wang ............... H01L 21/76897
(Continued)

OTHER PUBLICATIONS

Examination Report received for parallel TW patent application No. 109115711, dated Nov. 13, 2020, 3 pages (Reference Purpose Only).

*Primary Examiner* — Stephen W Smoot
(74) *Attorney, Agent, or Firm* — Viering Jentschura & Partner MBB

(57) ABSTRACT

A device may include a semiconductor-on-insulator (SOI) structure that may include a substrate, an insulator layer over the substrate, and a semiconductor layer over the insulator layer. The semiconductor layer may include a first conductivity region and a second conductivity region at least partially arranged within the semiconductor layer. The device may further include a gate structure arranged over the semiconductor layer and between the first conductivity region and the second conductivity region; a first conductor element arranged through the semiconductor layer and the insulator layer of the SOI structure to electrically contact the substrate; a second conductor element arranged to electrically contact the gate structure; and a conducting member connecting the first conductor element and the second conductor element to electrically couple the first conductor element and the second conductor element.

20 Claims, 15 Drawing Sheets

(51) Int. Cl.

| | | |
|---|---|---|
| *H01L 23/528* | (2006.01) | |
| *H01L 21/768* | (2006.01) | |
| *H01L 23/522* | (2006.01) | |
| *H01L 21/762* | (2006.01) | |
| *H01L 21/8234* | (2006.01) | |
| *H01L 29/06* | (2006.01) | |
| *H01L 29/66* | (2006.01) | |
| *H01L 29/786* | (2006.01) | |

(52) U.S. Cl.
CPC .. *H01L 21/76816* (2013.01); *H01L 21/76877* (2013.01); *H01L 21/823475* (2013.01); *H01L 21/823481* (2013.01); *H01L 23/528* (2013.01); *H01L 23/5226* (2013.01); *H01L 23/5283* (2013.01); *H01L 27/1207* (2013.01); *H01L 29/0653* (2013.01); *H01L 29/66568* (2013.01); *H01L 29/66651* (2013.01); *H01L 29/78651* (2013.01)

(56) References Cited

U.S. PATENT DOCUMENTS

| | | | |
|---|---|---|---|
| 2009/0068835 A1* | 3/2009 | La Tulipe, Jr. | H01L 23/481 |
| | | | 438/656 |
| 2010/0244934 A1* | 9/2010 | Botula | H01L 27/1203 |
| | | | 327/530 |
| 2013/0130479 A1 | 5/2013 | Stuber et al. | |
| 2013/0277854 A1* | 10/2013 | Wong | H01L 21/76898 |
| | | | 257/774 |
| 2014/0009212 A1 | 1/2014 | Altunkilic et al. | |
| 2014/0062575 A1 | 3/2014 | Hurwitz | |
| 2015/0097240 A1* | 4/2015 | Verma | H01L 21/84 |
| | | | 257/347 |
| 2016/0071758 A1 | 3/2016 | See et al. | |
| 2016/0104762 A1* | 4/2016 | Triyoso | H01L 27/0805 |
| | | | 257/532 |
| 2017/0098663 A1 | 4/2017 | Gu et al. | |
| 2017/0117358 A1 | 4/2017 | Kim et al. | |
| 2017/0170177 A1* | 6/2017 | Tasbas | H01L 21/84 |
| 2018/0076145 A1 | 3/2018 | Goktepeli | |

* cited by examiner

SEMICONDUCTOR DEVICE HAVING CONDUCTING MEMBER FOR ELECTRICALLY COUPLING GATE STRUCTURE TO UNDERLYING SUBSTRATE OF SOI STRUCTURE

TECHNICAL FIELD

The present disclosure relates generally to semiconductor devices and methods for forming the semiconductor devices.

BACKGROUND

Semiconductor devices are widely used in many applications, such as to communicate or amplify signals. For example, switch devices, such as radio frequency (RF) switch devices, are a type of semiconductor device often used in modern communication systems. To date, designing and fabricating switch devices with an ultra-wide bandwidth and good linearity remains challenging. In recent years, silicon-on-insulator (SOI) technology has been adopted for the design of switch devices. By fabricating the switch devices with SOI technology, the performance of the switch devices can be improved due to the reduced parasitic capacitance and the reduced substrate loss in the SOI structures. However, switch devices with SOI structures often suffer from problems, such as current leakage due to plasma charging during the wafer fabrication process. These problems can result in non-linearity in the switch devices and can reduce the power handling capability of the switch devices.

It is therefore desirable to provide an improved device that can overcome the above problems.

SUMMARY

According to various non-limiting embodiments, there may be provided a device including a semiconductor-on-insulator (SOI) structure including a substrate, an insulator layer over the substrate, and a semiconductor layer over the insulator layer. The semiconductor layer may include a first conductivity region and a second conductivity region at least partially arranged within the semiconductor layer. The device may further include a gate structure arranged over the semiconductor layer and between the first conductivity region and the second conductivity region; a first conductor element arranged through the semiconductor layer and the insulator layer of the SOI structure to electrically contact the substrate; a second conductor element arranged to electrically contact the gate structure; and a conducting member connecting the first conductor element and the second conductor element to electrically couple the first conductor element and the second conductor element.

According to various non-limiting embodiments, there may be provided a method including: providing a semiconductor-on-insulator (SOI) structure including a substrate, an insulator layer over the substrate, and a semiconductor layer over the insulator layer; forming a first conductivity region and a second conductivity region at least partially within the semiconductor layer; forming a gate structure over the semiconductor layer and between the first conductivity region and the second conductivity region; forming a first conductor element through the semiconductor layer and the insulator layer of the SOI structure to electrically contact the substrate; forming a second conductor element to electrically contact the gate structure; and forming a conducting member to connect the first conductor element and the second conductor element to electrically couple the first conductor element and the second conductor element.

According to various non-limiting embodiments, there may be provided a structure including a plurality of devices. One or more of the devices may include a semiconductor-on-insulator (SOI) structure including a substrate, an insulator layer over the substrate, and a semiconductor layer over the insulator layer. The semiconductor layer may include a first conductivity region and a second conductivity region at least partially arranged within the semiconductor layer. One or more of the devices may further include a gate structure arranged over the semiconductor layer and between the first conductivity region and the second conductivity region; a first conductor element arranged through the semiconductor layer and the insulator layer of the SOI structure to electrically contact the substrate; a second conductor element arranged to electrically contact the gate structure; and a conducting member connecting the first conductor element and the second conductor element to electrically couple the first conductor element and the second conductor element.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1:
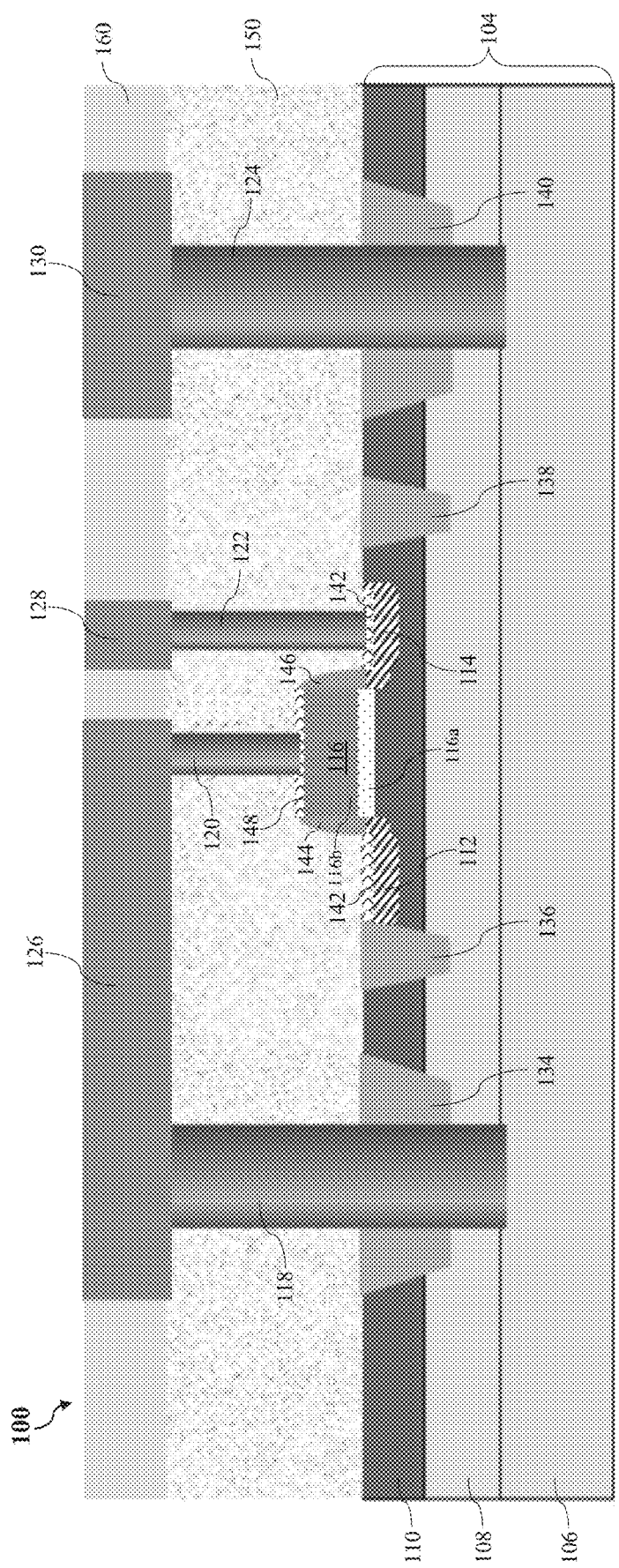
FIG. 1 shows a cross-sectional view of a device according to various non-limiting embodiments.

The embodiments generally relate to devices, such as semiconductor devices. More particularly, some embodiments relate to semiconductor devices that may include transistors. In various non-limiting embodiments, the semiconductor devices may be used as switch devices, for example, RF switch devices such as RF switch transistors. The switch devices may be employed in various types of switch structures, such as double pole double throw (DPDT) switch structures, which may in turn be used in communication systems. In various non-limiting embodiments, the semiconductor devices may be used in amplifiers. For example, the semiconductor devices may be used in low noise amplifiers and/or power amplifiers, which may in turn be used in various applications, such as, in communications systems and medical instruments.

According to various non-limiting embodiments, a device may include a semiconductor-on-insulator (SOI) structure including a substrate, an insulator layer over the substrate, and a semiconductor layer over the insulator layer. The semiconductor layer may include a first conductivity region and a second conductivity region at least partially arranged within the semiconductor layer. The device may further include a gate structure arranged over the semiconductor layer and between the first conductivity region and the second conductivity region; a first conductor element arranged through the semiconductor layer and the insulator layer of the SOI structure to electrically contact the substrate; a second conductor element arranged to electrically contact the gate structure; and a conducting member connecting the first conductor element and the second conductor element to electrically couple the first conductor element and the second conductor element.

According to various non-limiting embodiments, a method may include: providing a semiconductor-on-insulator (SOI) structure including a substrate, an insulator layer over the substrate, and a semiconductor layer over the insulator layer; forming a first conductivity region and a second conductivity region at least partially within the semiconductor layer; forming a gate structure over the semiconductor layer and between the first conductivity region and the second conductivity region; forming a first conductor element through the semiconductor layer and the insulator layer of the SOI structure to electrically contact the substrate; forming a second conductor element to electrically contact the gate structure; and forming a conducting member to connect the first conductor element and the second conductor element to electrically couple the first conductor element and the second conductor element.

According to various non-limiting embodiments, a diameter of the first conductor element may be greater than a diameter of the second conductor element.

According to various non-limiting embodiments, the semiconductor layer of the SOI structure may further include an isolation region at least partially arranged therein. The first conductor element may be arranged through the isolation region.

According to various non-limiting embodiments, the method may further include forming an isolation region at least partially within the semiconductor layer of the SOI structure. Forming the first conductor element may include forming the first conductor element through the isolation region.

According to various non-limiting embodiments, the isolation region may extend at least partially into the insulator layer.

According to various non-limiting embodiments, the device may further include a third conductor element arranged to electrically contact the second conductivity region. The third conductor element may be electrically isolated from the first conductor element and the second conductor element.

According to various non-limiting embodiments, the device may further include a fourth conductor element arranged through the semiconductor layer and the insulator layer of the SOI structure to electrically contact the substrate. The fourth conductor element may be electrically isolated from the first conductor element and the second conductor element.

According to various non-limiting embodiments, the device may further include a fifth conductor element arranged to electrically contact the first conductivity region. The fifth conductor element may be electrically isolated from the first conductor element and the second conductor element.

According to various non-limiting embodiments, the device may be a RF switch transistor, a single pole multiple throw switch (e.g. a single pole double throw switch or a single pole quadruple throw switch), or a multiple pole multiple throw switch (e.g. a double pole double throw switch).

According to various non-limiting embodiments, forming the first conductor element may include a first mask and forming the second conductor element may include a second mask. The first mask may be different from the second mask.

According to various non-limiting embodiments, forming the first conductor element and the second conductor element may include: forming a first opening for the first conductor element with the first mask; and forming a second opening for the second conductor element with the second mask, and depositing conductive material into the first opening and the second opening simultaneously to form the first conductor element and the second conductor element, respectively.

According to various non-limiting embodiments, the method may further include: forming an insulating layer over the semiconductor layer such that the gate structure is arranged at least partially within the insulating layer; forming the first mask by depositing a first mask material over the insulating layer; and forming the second mask by depositing a second mask material over the insulating layer and into the first opening.

According to various non-limiting embodiments, the method may further include forming a third conductor element to electrically contact the second conductivity region. The third conductor element may be electrically isolated from the first conductor element and the second conductor element.

According to various non-limiting embodiments, the method may further include forming a fourth conductor element through the semiconductor layer and the insulator layer of the SOI structure to electrically contact the substrate. The fourth conductor element may be electrically isolated from the first conductor element and the second conductor element.

According to various non-limiting embodiments, the method may further include forming a fifth conductor element to electrically contact the first conductivity region. The fifth conductor element may be electrically isolated from the first conductor element and the second conductor element.

According to various non-limiting embodiments, a structure may include a plurality of devices. One or more of the devices may include a semiconductor-on-insulator (SOI) structure including a substrate, an insulator layer over the substrate, and a semiconductor layer over the insulator layer. The semiconductor layer may include a first conductivity region and a second conductivity region at least partially arranged within the semiconductor layer. One or more of the devices may further include a gate structure arranged over the semiconductor layer and between the first conductivity region and the second conductivity region; a first conductor element arranged through the semiconductor layer and the insulator layer of the SOI structure to electrically contact the substrate; a second conductor element arranged to electrically contact the gate structure; and a conducting member connecting the first conductor element and the second conductor element to electrically couple the first conductor element and the second conductor element.

According to various non-limiting embodiments, the one or more of the devices of the structure may include a RF switch transistor, a single pole multiple throw switch (e.g. a single pole double throw switch or a single pole quadruple throw switch), or a multiple pole multiple throw switch (e.g. a double pole double throw switch) or combinations thereof.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a cross-sectional view of a device 100 according to various non-limiting embodiments. In various non-limiting embodiments, the device 100 may be a semiconductor device including a transistor. For example, the device 100 may include an n-type metal oxide semiconductor (NMOS) or a p-type metal oxide semiconductor (PMOS). In various non-limiting embodiments, the device 100 may be a switch device for use in a switch structure. For example, the device 100 may include a switch transistor. For example, the device 100 may be a RF switch device such as a RF switch transistor. For example, the device 100 may be a single pole multiple throw switch (e.g. a single pole double throw (SP4T) switch, a single pole quadruple throw (SPDT) switch) or a multiple pole multiple throw switch (e.g. a double pole double throw (DPDT) switch). In various non-limiting embodiments, the device 100 may be used for fabricating a low noise amplifier. In various non-limiting embodiments, the device 100 may be used for fabricating a power amplifier.

As shown in FIG. 1, in various non-limiting embodiments, the device 100 may include a semiconductor-on-insulator (SOI) structure 104. The SOI structure 104 may include a substrate 106, an insulator layer 108 over the substrate 106, and a semiconductor layer 110 over the insulator layer 108. In various non-limiting embodiments, the substrate 106 may be referred to as a handle substrate.

In various non-limiting embodiments, the semiconductor layer 110 may include a first conductivity region 112 and a second conductivity region 114 at least partially arranged within the semiconductor layer 110. The first conductivity region 112 may be a source region and the second conductivity region 114 may be a drain region. However, in alternative non-limiting embodiments, the first conductivity region 112 may be a drain region and the second conductivity region 114 may be a source region. A silicide layer 142 may be arranged over each of the first and second conductivity regions 112, 114.

In various non-limiting embodiments, the semiconductor layer 110 of the SOI structure 104 may further include a first isolation region 134, a second isolation region 136, a third isolation region 138 and a fourth isolation region 140 at least partially arranged therein. Each of the first isolation region 134, second isolation region 136, third isolation region 138 and fourth isolation region 140 may extend at least partially into the insulator layer 108. For example, as shown in FIG. 1, each isolation region 134, 136, 138, 140 may extend through the entire semiconductor layer 110 and part of the insulator layer 108. In addition, each isolation region 134, 136, 138, 140 may taper towards the substrate 106. In various non-limiting embodiments, the second isolation region 136 may be arranged between the first isolation region 134 and the first conductivity region 112. For example, as shown in FIG. 1, the second isolation region 136 may be arranged adjacent to the first conductivity region 112 and in contact with the first conductivity region 112. However, in alternative non-limiting embodiments, the second isolation region 136 may be spaced apart from the first conductivity region 112. In various non-limiting embodiments, the third isolation region 138 may be arranged between the fourth isolation region 140 and the second conductivity region 114. For example, as shown in FIG. 1, the third isolation region 138 may be arranged adjacent to the second conductivity region 114, spaced apart from the second conductivity region 114. However, in alternative non-limiting embodiments, the third isolation region 138 may be in contact with the second conductivity region 114.

Referring to FIG. 1, in various non-limiting embodiments, the device 100 may include a gate structure 116 arranged over the semiconductor layer 110 and between the first conductivity region 112 and the second conductivity region 114. As shown in FIG. 1, the gate structure 116 may include a gate oxide layer 116a and a gate element 116b arranged over the gate oxide layer 116a. The gate oxide layer 116a may be arranged over the semiconductor layer 110. The device 100 may further include a first spacer 144 and a second spacer 146 arranged adjacent to the gate element 116b. In various non-limiting embodiments, another silicide layer 148 may be arranged over the gate element 116b.

In various non-limiting embodiments, the device 100 may further include a first conductor element 118 arranged through the semiconductor layer 110 and the insulator layer 108 of the SOI structure 104 to electrically contact the substrate 106. For example, referring to FIG. 1, the first conductor element 118 may be arranged through the first isolation region 134, the insulator layer 108 and part of the substrate 106 to electrically contact the substrate 106. In various non-limiting embodiments, the device 100 may further include a second conductor element 120 arranged to electrically contact the gate structure 116. For example, the second conductor element 120 may contact the conductive silicide layer 148 to electrically contact the gate element 116b of the gate structure 116. In various non-limiting embodiments, the device 100 may further include a third conductor element 122 arranged to electrically contact the second conductivity region 114. As shown in FIG. 1, the third conductor element 122 may contact the conductive silicide layer 142 to electrically contact the second conductivity region 114. In various non-limiting embodiments, the device 100 may further include a fourth conductor element 124 arranged through the semiconductor layer 110 and the insulator layer 108 of the SOI structure 104 to electrically contact the substrate 106. For example, referring to FIG. 1, the fourth conductor element 124 may extend through the fourth isolation region 140, the insulator layer 108 and part of the substrate 106 to electrically contact the substrate 106.

In various non-limiting embodiments, the second conductor element 120 and the third conductor element 122 may be normal contacts; whereas, the first conductor element 118 and the fourth conductor element 124 may be through-body contacts (TBCs). In various non-limiting embodiments, the design rules for TBCs may not be as stringent as the design rules for normal contacts. For example, the pitch requirements for TBCs may not be as stringent as the pitch requirements for normal contacts. Therefore, TBCs may be of a larger size than normal contacts in various non-limiting embodiments. In various non-limiting embodiments, diameters of the first conductor element 118 and the fourth conductor element 124 may be approximately equal, and diameters of the second conductor element 120 and third conductor element 122 may be approximately equal. In various non-limiting embodiments, a diameter of the first conductor element 118 may be greater than a diameter of the second conductor element 120. The diameter of the first conductor element 118 may also be greater than a diameter of the third conductor element 122. In various non-limiting embodiments, a diameter of the fourth conductor element 124 may be greater than a diameter of the second conductor element 120 and a diameter of the third conductor element 122. In various non-limiting embodiments, a diameter of the first conductor element 118 may range from about 0.28 um to about 0.4 um, a diameter of the second conductor element 120 may range from about 0.12 um to about 0.20 um, a diameter of the third conductor element 122 may range from about 0.12 um to about 0.20 um, and a diameter of the fourth conductor element 124 may range from about 0.28 um to about 0.4 um. In various non-limiting embodiments, a diameter of the first conductor element 118 compared to a diameter of the second conductor element 120 may have a ratio ranging from about 1.5 to about 2.5, a diameter of the first conductor element 118 compared to a diameter of the third conductor element 122 may have a ratio ranging from about 1.5 to about 2.5, a diameter of the fourth conductor element 124 compared to a diameter of the second conductor element 120 may have a ratio ranging from about 1.5 to about 2.5, and a diameter of the fourth conductor element 124 compared to a diameter of the third conductor element 122 may have a ratio ranging from about 1.5 to about 2.5. However, the diameters of the conductor elements 118, 120, 122, 124 may be different in alternative non-limiting embodiments.

In various non-limiting embodiments, the device 100 may further include a first insulating layer 150 arranged over the SOI structure 104. For example, as shown in FIG. 1, the first insulating layer 150 may be arranged over the semiconductor layer 110 of the SOI structure 104. Each conductor element 118-124 may be arranged at least partially within the first insulating layer 150, spaced apart from one another. In various non-limiting embodiments, the device 100 may further include a second insulating layer 160 arranged over the first insulating layer 150.

The device 100 may also include a first conducting member 126, a second conducting member 128, and a third conducting member 130 arranged at least partially within the second insulating layer 160. In various non-limiting embodiments, the conducting members 126, 128, 130 may be spaced apart from one another. As shown in FIG. 1, in various non-limiting embodiments, the first conducting member 126 may connect the first conductor element 118 and the second conductor element 120 to electrically couple the first conductor element 118 and the second conductor element 120. For example, the first conductor element 118 and the second conductor element 120 may each be connected to the first conducting member 126 and the first conducting member 126 may extend across a width of the second insulating layer 160. In various non-limiting embodiments, the third conductor element 122 may be electrically isolated from the first conductor element 118 and the second conductor element 120. For example, as shown in FIG. 1, the third conductor element 122 may be connected to the second conducting member 128 which may be spaced apart from the first conducting member 126. In other words, the third conductor element 122 may be electrically isolated from the first and second conductor elements 118, 120 via a part of the first insulating layer 150 (between the conductor elements 118, 120, 122) and a part of the second insulating layer 160 (between the conducting members 126, 128). In various non-limiting embodiments, the fourth conductor element 124 may be electrically isolated from the first conductor element 118 and the second conductor element 120. For example, as shown in FIG. 1, the fourth conductor element 124 may be connected to the third conducting member 130 which may be spaced apart from the first conducting member 126. In other words, the fourth conductor element 124 may be electrically isolated from the first and second conductor elements 118, 120 via a part of the first insulating layer 150 (between the conductor elements 118, 120, 124) and a part of the second insulating layer 160 (between the conducting members 126, 130). In various non-limiting embodiments, the fourth conductor element 124 may be electrically isolated from the third conductor element 122. For example, as shown in FIG. 1, the third conducting member 130 (to which the fourth conductor element 124 may be connected) may be spaced apart from the second conducting member 128. Thus, the fourth conductor element 124 may be electrically isolated from the third conductor element 122 via a part of the first insulating layer 150 (between the conductor elements 122, 124) and a part of the second insulating layer 160 (between the conducting members 128, 130).

In various non-limiting embodiments, the device 100 may be fabricated with 130 nm radio frequency SOI (RFSOI) technology on 300 nm substrate. However, the device 100 may be fabricated using other technologies as known to those skilled in the art in alternative non-limiting embodiments. FIGS. 2A to 2G show cross-sectional views that illustrate a method for fabricating the device 100 according to various non-limiting embodiments.

Figure 2A:
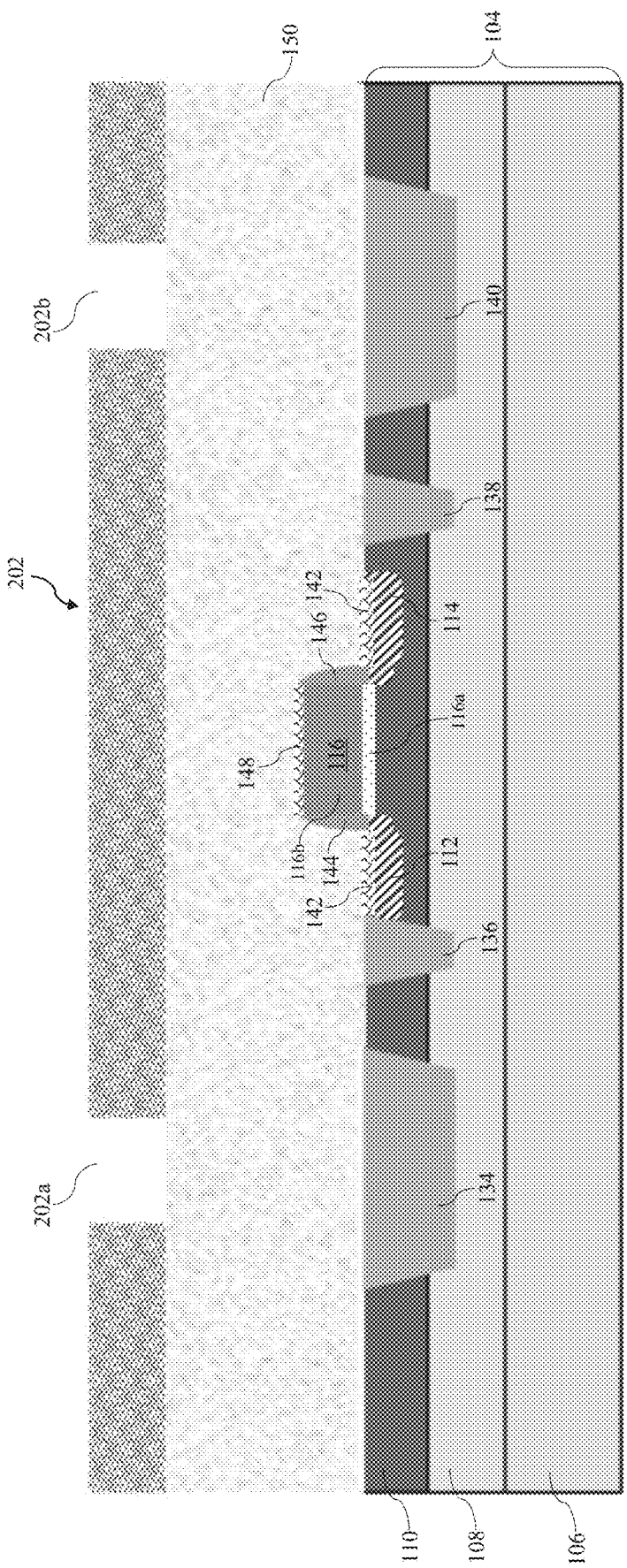
FIGS. 2A to 2G show cross-sectional views that illustrate a method for fabricating the device of FIG. 1 according to various non-limiting embodiments.

Referring to FIG. 2A, according to various non-limiting embodiments, a method for fabricating the device 100 may begin by providing the (SOI) structure 104 including the substrate 106, the insulator layer 108 over the substrate 106, and the semiconductor layer 110 over the insulator layer 108. In various non-limiting embodiments, the substrate 106 may include a silicon wafer. In various non-limiting embodiments, the insulator layer 108 may be a buried oxide layer. In various non-limiting embodiments, the insulator layer 108 may include silicon oxide, sapphire or combinations thereof. In various non-limiting embodiments, the semiconductor layer 110 may include single crystalline silicon. However, other materials as known to those skilled in the art may be used. In various non-limiting embodiments, the insulator layer 108 may be thicker than the semiconductor layer 110 and may be thinner than the substrate 106. In various non-limiting embodiments, a thickness of the substrate 106 may range from about 750 um to about 800 um, a thickness of the insulator layer 108 may range from about 2000 Å to about 4000 Å and a thickness of the semiconductor layer 110 may range from about 500 Å to about 1600 Å.

Referring to FIG. 2A, in various non-limiting embodiments, the method may further include forming the first conductivity region 112 and the second conductivity region 114 at least partially within the semiconductor layer 110, and the silicide layer 142 over each conductivity region 112, 114. Each of the first and second conductivity regions 112, 114, and the semiconductor layer 110 may include one or more dopants. In various non-limiting embodiments, the first and second conductivity regions 112, 114 may have approximately equal doping concentrations (i.e. approximately equal concentrations of dopants). The doping concentrations of the first and second conductivity regions 112, 114 may be higher than the doping concentration of the semiconductor layer 110. In various non-limiting embodiments, the doping concentration of the first conductivity region 112 may range from about 1e12 $cm^{-2}$ to about 1e16 $cm^{-2}$, the doping concentration of the second conductivity region 114 may range from about 1e12 $cm^{-2}$ to about 1e16 $cm^{-2}$ and the doping concentration of the semiconductor layer 110 may range from about 4e10 $cm^{-2}$ to about 6e10 $cm^{-5}$. The first and second conductivity regions 112, 114 may have a first conductivity type. For example, the first and second conductivity regions 112, 114 may both have a p-type conductivity, in other words, include dopants having a p-type conductivity (e.g. p-type dopants). Alternatively, the first and second conductivity regions 112, 114 may both have an n-type conductivity, in other words, include dopants having an n-type conductivity (e.g. n-type dopants). In various non-limiting embodiments, the semiconductor layer 110 may have a second conductivity type different from the first conductivity type. For example, when the first and second conductivity regions 112, 114 have a p-type conductivity, the semiconductor layer 110 may have an n-type conductivity. Alternatively, when the first and second conductivity regions 112, 114 have an n-type conductivity, the semiconductor layer 110 may have a p-type conductivity. In one example, the implant material for the first and second conductivity regions 112, 114 and the semiconductor layer 110 may be the same implant material, for example, an epitaxial silicon material in a non-limiting embodiment. The p-type material may be or include, but is not limited to epitaxial silicon germanium and/or the n-type material may be or include, but is not limited to doped silicon material including n-type dopants. P-type dopants can for example, include but are not limited to boron (B), aluminium (Al), indium (In) or a combination thereof, while n-type dopants can include carbon (C), phosphorus (P), arsenic (As), antimony (Sb), or a combination thereof. Other types of implant materials and dopants as known to those skilled in the art may also be useful for forming the first and second conductivity regions 112, 114 and semiconductor layer 110.

Referring to FIG. 2A, the method may further include forming the gate structure 116 over the semiconductor layer 110 and between the first conductivity region 112 and the second conductivity region 114. The first and second conductivity regions 112, 114, and the gate structure 116 may be formed using any technique as known to those skilled in the art. In various non-limiting embodiments, the conductivity regions 112, 114 may be formed before forming the gate structure 116. For example, the first and second conductivity regions 112, 114 may be disposed into the semiconductor layer 110 by ion implantation with an implant mask (e.g. a photoresist mask) having gaps to expose regions of the semiconductor layer 110 intended for the conductivity regions 112, 114. The implant mask may be formed over the semiconductor layer 110, and either p-type dopants (when the conductivity regions 112, 114 have p-type conductivity) or n-type dopants (when the conductivity regions 112, 114 have n-type conductivity) may be introduced into the exposed regions of the semiconductor layer 110. The implant mask may then be removed and the gate structure 116 may be subsequently formed over the semiconductor layer 110 between the conductivity regions 112, 114. In alternative non-limiting embodiments, the gate structure 116 may be formed before forming the conductivity regions 112, 114. For example, the gate structure 116 may first be formed over the semiconductor layer 110, and the first and second conductivity regions 112, 114 may then be formed by ion implantation using the gate structure 116 as a mask. In various non-limiting embodiments, the gate structure 116 may be formed by depositing an oxide layer over the semiconductor layer 110 and an electrode layer over the oxide layer, and etching the oxide layer and the electrode layer to form the gate oxide layer 116a and the gate element 116b respectively. The silicide layer 148 may then be formed over the gate element 116b using any technique as known to those skilled in the art. In various non-limiting embodiments, the electrode layer for forming the gate element 116b may include polysilicon or other conductive materials, such as metals or alloys for example TiN, TaN, W, or combinations thereof, but other materials as known to those skilled in the art may also be used. In various non-limiting embodiments, the oxide layer for forming the gate oxide layer 116a may include silicon dioxide or other materials as known to those skilled in the art. In various non-limiting embodiments, the silicide layers 142, 148 may include one or more silicides such as, but not limited to, cobalt silicide (CoSi2), nickel silicide (NiSi), titanium silicide (TiSi2), tantalum silicide (TaSi2), platinum silicide (PtSi), palladium silicide (Pd2Si), rhodium silicide (RhSi), or combinations thereof. The silicide layers 142, 148 may include the same or different types of silicides.

Referring to FIG. 2A, the method may also include forming the first and second spacers 144, 146 adjacent to the gate element 116b. The first and second spacers 144, 146 may be formed by depositing a spacer layer over the gate structure 116 and etching the spacer layer. However, other techniques as known to those skilled in the art may also be used. In various non-limiting embodiments, the first and second spacers 144, 146 may include an insulating material. In various non-limiting embodiments, the first and second spacers 144, 146 may include dielectric material such as, but not limited to, silicon oxide, silicon nitride, silicon oxynitride, combinations thereof, or multiple layers of insulating materials. Other materials as known to those skilled in the art may also be used.

Referring to FIG. 2A, in various non-limiting embodiments, the method may further include forming the first isolation region 134, the second isolation region 136, the third isolation region 138 and the fourth isolation region 140 at least partially within the semiconductor layer 110 of the SOI structure 104. The isolation regions 134, 136, 138, 140 may be formed such that they extend at least partially into the insulator layer 108. The isolation regions 134, 136, 138, 140 may be formed by etching the SOI structure 104 (e.g. the semiconductor layer 110 and the insulator layer 108) to form trenches and depositing isolation material into the trenches. In various non-limiting embodiments, the isolation regions 134, 136, 138, 140 may include shallow trench isolation regions (STIs). In various non-limiting embodiments, the isolation material for forming the isolation regions 134, 136, 138, 140 may include a gap fill oxide or nitride, or a combination of both. However, the isolation regions 134, 136, 138, 140 may be formed using other techniques as known to those skilled in the art and/or may include other materials as known to those skilled in the art.

Referring to FIG. 2A, in various non-limiting embodiments, the method may further include forming the first insulating layer 150 over the semiconductor layer 110, such that the gate structure 116 may be arranged at least partially within the first insulating layer 150. The first insulating layer 150 may be formed by depositing a first insulating material over the semiconductor layer 110, the gate structure 116 and the spacers 144, 146 using any technique as known to those skilled in the art. In various non-limiting embodiments, the first insulating layer 150 may include silicon oxide, silicon dioxide, silicon nitride or combinations thereof, but other materials as known to those skilled in the art may be used.

Referring to FIGS. 2A-2G, the method may further include forming the first conductor element 118 through the semiconductor layer 110 and the insulator layer 108 of the SOI structure 104 to electrically contact the substrate 106. The method may further include forming the second conductor element 120 to electrically contact the gate structure 116, and forming the third conductor element 122 to electrically contact the second conductivity region 114. The method may further include forming the fourth conductor element 124 through the semiconductor layer 110 and the insulator layer 108 of the SOI structure 104 to electrically contact the substrate 106. In various non-limiting embodiments, forming the conductor elements 118, 120, 122, 124 may include photolithography. However, other techniques as known to those skilled in the art may also be used.

Referring to FIG. 2A, in various non-limiting embodiments, forming the first conductor element 118 and forming the fourth conductor element 124 may include a first mask 202. For example, the method may include forming the first mask 202 over the first insulating layer 150. As shown in FIG. 2A, in various non-limiting embodiments, the first mask 202 may include a first gap 202a and a second gap 202b respectively above where the first and fourth conductor elements 118, 124 are to be formed. Accordingly, the first and second gaps 202a, 202b of the first mask 202 may expose the portions of the first insulating layer 150 and the SOI structure 104 where the first and fourth conductor elements 118, 124 are to be formed. In various non-limiting embodiments, the first mask 202 may be formed by depositing a first mask material over the first insulating layer 150 using techniques as known to those skilled in the art. In various non-limiting embodiments, the first mask 202 may be a photoresist mask and the first mask material may include light-sensitive material as known to those skilled in the art, but other types of masks as known to those skilled in the art may also be used.

Figure 2B:
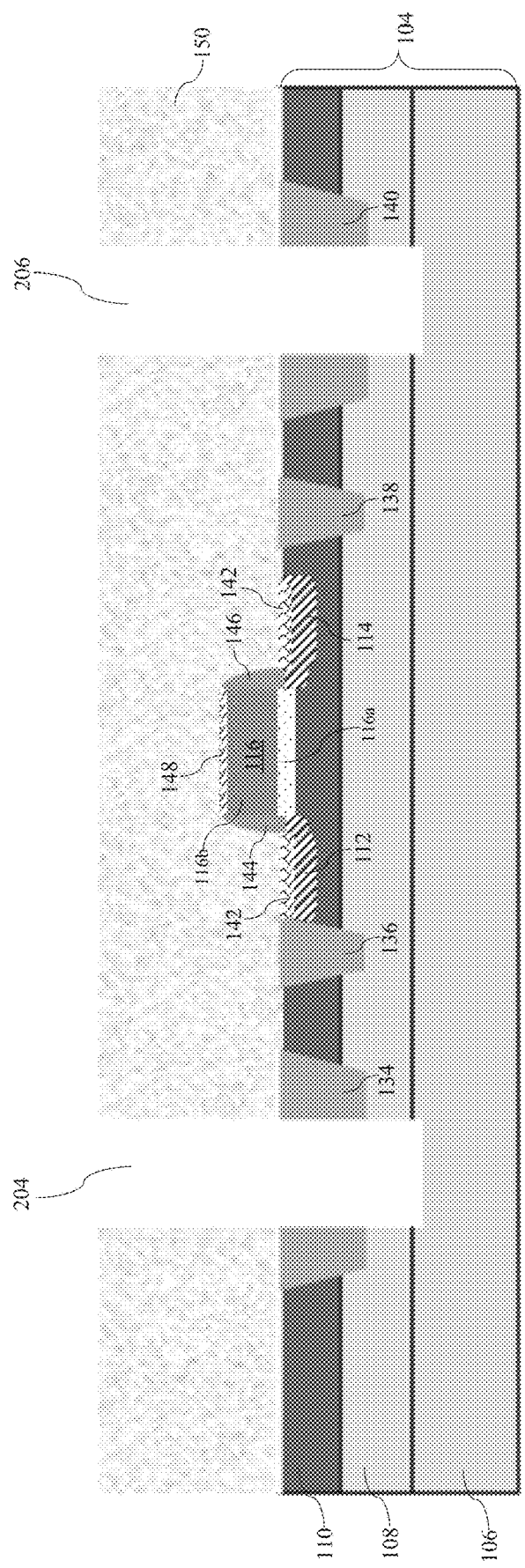

Referring to FIG. 2B, in various non-limiting embodiments, forming the first and fourth conductor elements 118, 124 may further include forming first openings 204, 206 with the first mask 202. For example, the first openings 204, 206 may be formed by etching the exposed portions of the first insulating layer 150, the semiconductor layer 110, the insulator layer 108 and the substrate 106 under the first and second gaps 202a, 202b of the first mask 202 respectively. In various non-limiting embodiments, forming the first conductor element 118 and the fourth conductor element 124 may include forming the first conductor element 118 and the fourth conductor element 124 through the first and fourth isolation regions 134, 140 respectively. For example, the opening 204 for the first conductor element 118 may be formed by etching the first insulating layer 150, the first isolation region 134, the insulator layer 108 and the substrate 106; whereas, the opening 206 for the fourth conductor element 124 may be formed by etching the first insulating layer 150, the fourth isolation region 140, the insulator layer 108, and the substrate 106. The first openings 204, 206 for the first and fourth conductor elements 118, 124 may be formed simultaneously in various non-limiting embodiments, but may alternatively be formed sequentially in alternative non-limiting embodiments. The method may further include removing the first mask 202 after forming the first openings 204, 206. Removing the first mask 202 may be done using any technique as known to those skilled in the art, such as, but not limited to, photoresist stripping.

Figure 2C:
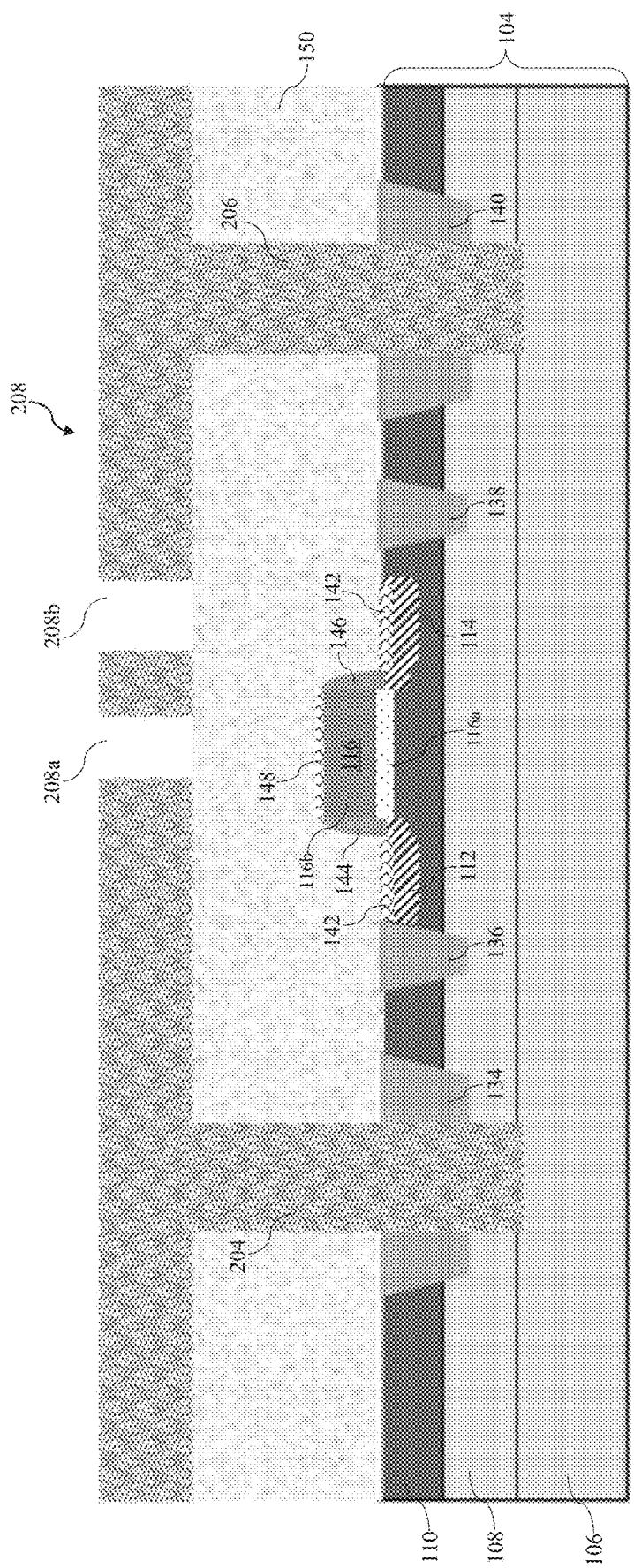

Referring to FIG. 2C, in various non-limiting embodiments, forming the second conductor element 120 and the third conductor element 122 may include a second mask 208. In various non-limiting embodiments, the first mask 202 may be different from the second mask 208. For example, as shown in FIG. 2C, the method may further include forming the second mask 208 over the first insulating layer 150, such that at least a part of the second mask 208 extends into the first openings 204, 206. In various non-limiting embodiments, the second mask 208 may include a first gap 208a and a second gap 208b respectively above where the second conductor element 120 and the third conductor element 122 are to be formed. Accordingly, the first and second gaps 208a, 208b of the second mask 208 may expose portions of the first insulating layer 150 and the silicide layers 142, 148 where the second and third conductor elements 120, 122 are to be formed. In various non-limiting embodiments, the second mask 208 may be formed by depositing a second mask material over the first insulating layer 150 and into the first openings 204, 206 using techniques as known to those skilled in the art. In various non-limiting embodiments, the second mask 208 may be a photoresist mask and the second mask material may include light-sensitive material as known to those skilled in the art, but other types of masks as known to those skilled in the art may also be used. The second mask material for forming the second mask 208 may be the same or may be different from the first mask material for forming the first mask 202.

Figure 2D:
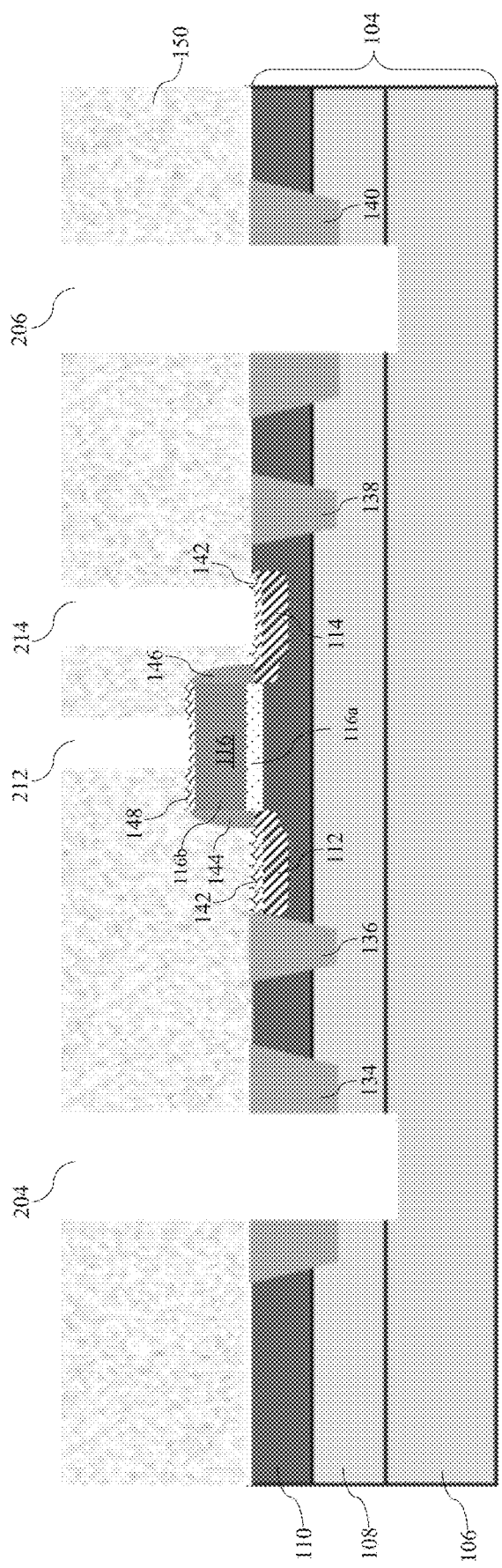

Referring to FIG. 2D, forming the second and third conductor elements 120, 122 may include forming second openings 212, 214 for the second and third conductor elements 120, 122 with the second mask 208. For example, the second openings 212, 214 may be formed by etching the exposed portions of the first insulating layer 150 and the silicide layers 142, 148 under the gaps 208a, 208b of the second mask 208. For example, the opening 212 for the second conductor element 120 may be formed by etching the first insulating layer 150 and the silicide layer 148 over the gate element 116b and under the first gap 208a of the second mask 208, and the opening 214 for the third conductor element 122 may be formed by etching the first insulating layer 150 and the silicide layer 142 under the second gap 208b of the second mask 208. The second openings 212, 214 may be formed simultaneously in various non-limiting embodiments. However, the second openings 212, 214 may alternatively be formed sequentially in alternative non-limiting embodiments. Referring to FIG. 2D, in various non-limiting embodiments, the method may further include removing the second mask 208 after forming the second openings 212, 214. In various non-limiting embodiments, removing the second mask 208 may be carried out by any technique as known to those skilled in the art, such as but not limited to, photoresist stripping. Removing the second mask 208 may expose the first openings 204, 206.

Figure 2E:
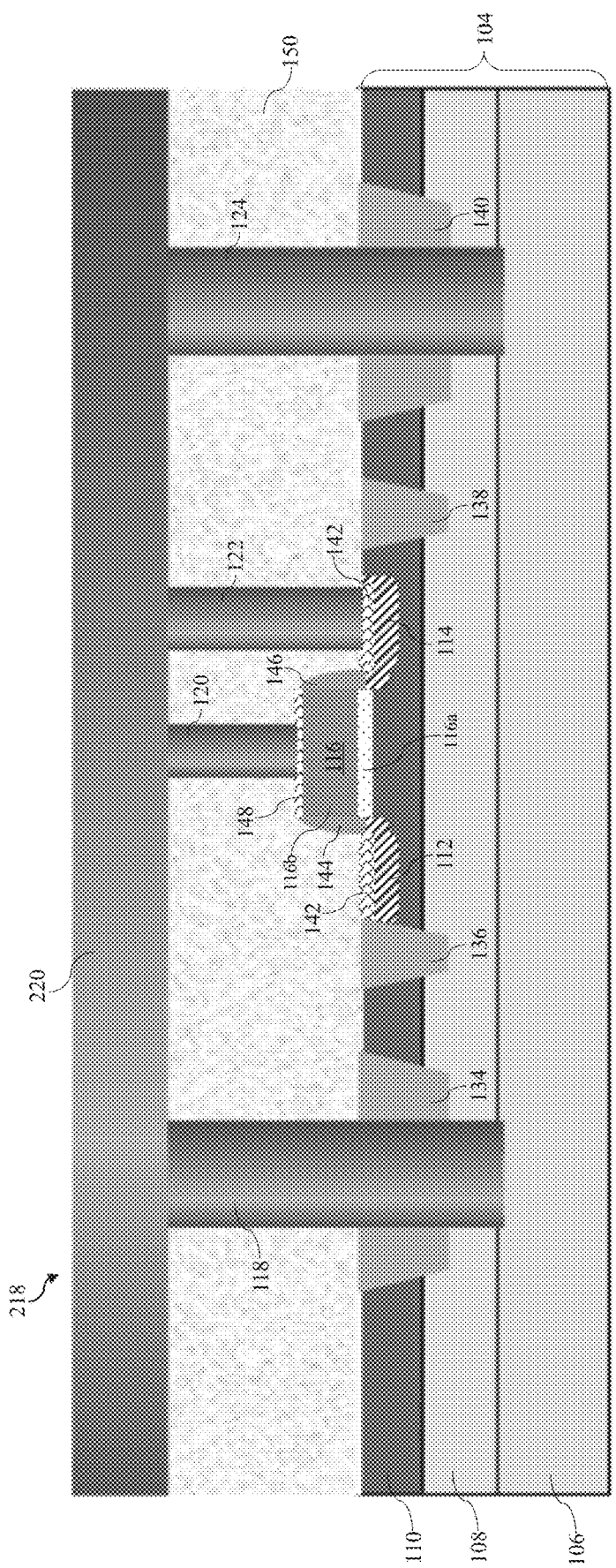

Referring to FIG. 2E, the method may further include depositing conductive material 218 into the first openings 204, 206 and the second openings 212, 214 simultaneously to form the first conductor element 118, the fourth conductor element 124, the second conductor element 120 and the third conductor element 122, respectively. In other words, the conductor elements 118-124 may be formed simultaneously in a non-limiting embodiment. In various non-limiting embodiments, as shown in FIG. 2E, depositing the conductive material 218 may further form a top conductive layer 220 over the conductor elements 118, 124, 120, 122.

In various alternative non-limiting embodiments, the conductor elements 118, 124, 120, 122 may not be formed simultaneously. In a non-limiting example, after removing the first mask 202, conductive material may be deposited into the first openings 204, 206 to form the first and fourth conductor elements 118, 124 before forming the second mask 208 over the first insulating layer 150. In this non-limiting example, the second mask 208 may not extend into the first openings 204, 206. In this non-limiting example, after forming the second openings 212, 214 and removing the second mask 208, conductive material may then be deposited into the second openings 212, 214 to form the second and third conductor elements 120, 122.

In various non-limiting embodiments, the conductive material may be deposited using techniques such as, but not limited to, linear deposition by Wolfram chemical vapour deposition (WCVD). In various non-limiting embodiments, the conductive material for forming the conductor elements 118, 120, 122, 124 may include aluminum, copper, tungsten, alloys thereof, or combinations thereof. However, other materials as known to those skilled in the art may be used.

In various non-limiting embodiments as shown in FIG. 2E, each of the first and fourth conductor elements 118, 124 may be formed with a single deposition process. In other words, the conductive material may be deposited only once into the first openings 204, 206. However, in alternative non-limiting embodiments, each conductor element 118, 124 may be formed with more than one deposition processes. For example, a lower part of the openings 204, 206 may first be formed and filled with conductive material, after which an upper part of the openings 204, 206 may then be formed and filled with conductive material.

Figure 2F:
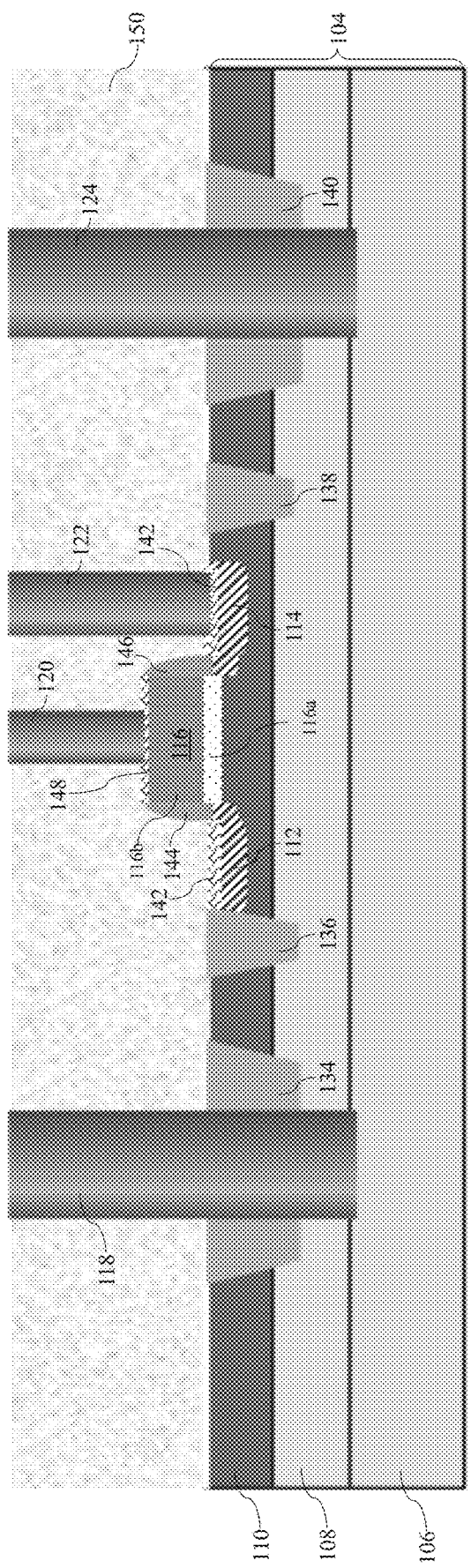

Referring to FIG. 2F, the method may further include removing the top conductive layer 220 by for example, smoothing a top surface of the first insulating layer 150. For example, the top conductive layer 220 may be removed using techniques such as, but not limited to, Wolfram chemical mechanical polishing (WCMP).

Figure 2G:
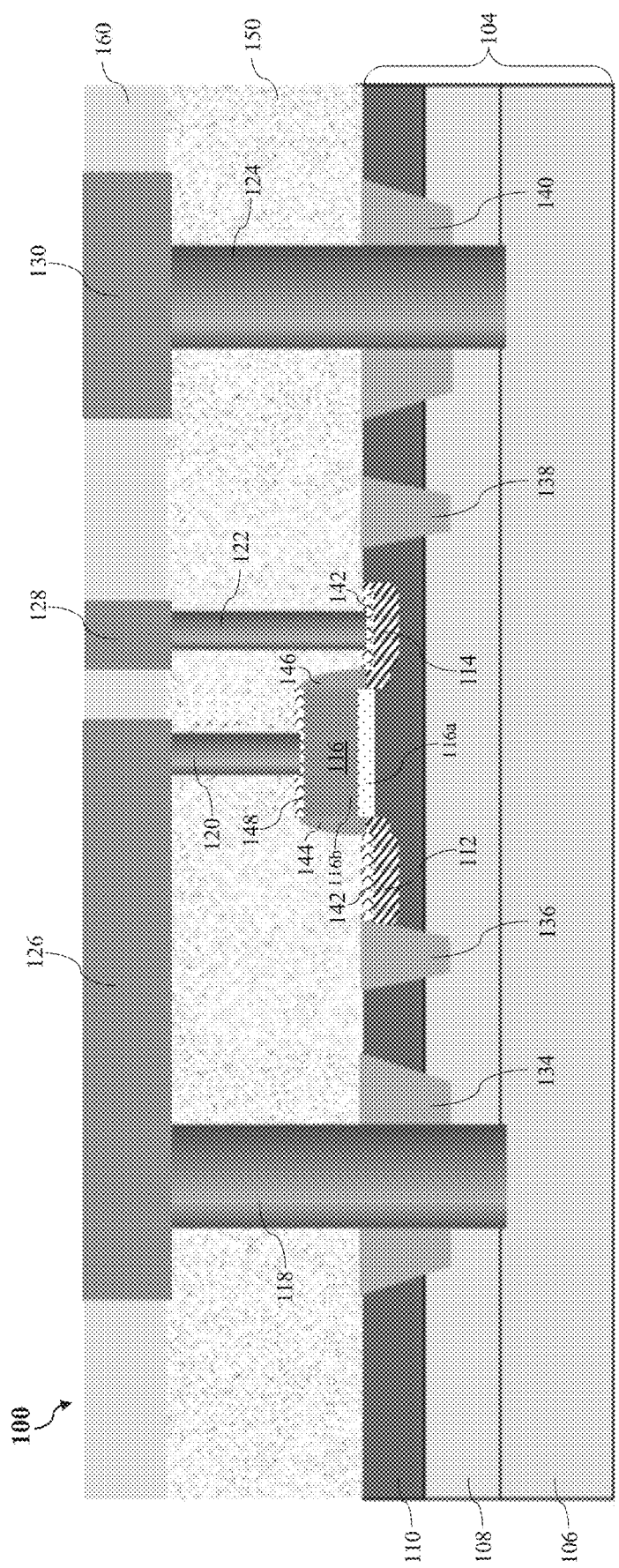

Referring to FIG. 2G, the method may further include forming the first conducting member 126 to connect the first conductor element 118 and the second conductor element 120 to electrically couple the first conductor element 118 and the second conductor element 120. The method may further include forming the second conducting member 128 to connect to the third conductor element 122 and forming the third conducting member 130 to connect to the fourth conductor element 124. In various non-limiting embodiments, the first, second, and third conducting members 126, 128, 130 may be formed simultaneously. For example, the method may include forming the second insulating layer 160 by depositing a second insulating material over the first insulating layer 150. The second insulating material may then be etched to form openings at where the conducting members 126, 128, 130 are to be formed, and conductive material may then be deposited into these openings. The deposition of the second insulating material, the etching of the second insulating material and the deposition of the conductive material may be carried out using any technique as known to those skilled in the art. In various non-limiting embodiments, the second insulating material may be the same as the first insulating material of the first insulating layer 150. However, in alternative non-limiting embodiments, the second insulating material may be different from the first insulating material. The second insulating material for forming the second insulating layer 160 may include silicon oxide, silicon dioxide, silicon nitride, or combinations thereof, but other materials as known to those skilled in the art may also be used. The conductive material for forming the conducting members 126, 128, 130, and the conductive material for forming the conductor elements 118, 120, 122, 124 may be the same in some non-limiting embodiments, or may be different in other alternative non-limiting embodiments. In various non-limiting embodiments, the conductive material for forming the conducting members 126, 128, 130 may include aluminum, copper, tungsten, alloys thereof, or combinations thereof.

Figure 3:
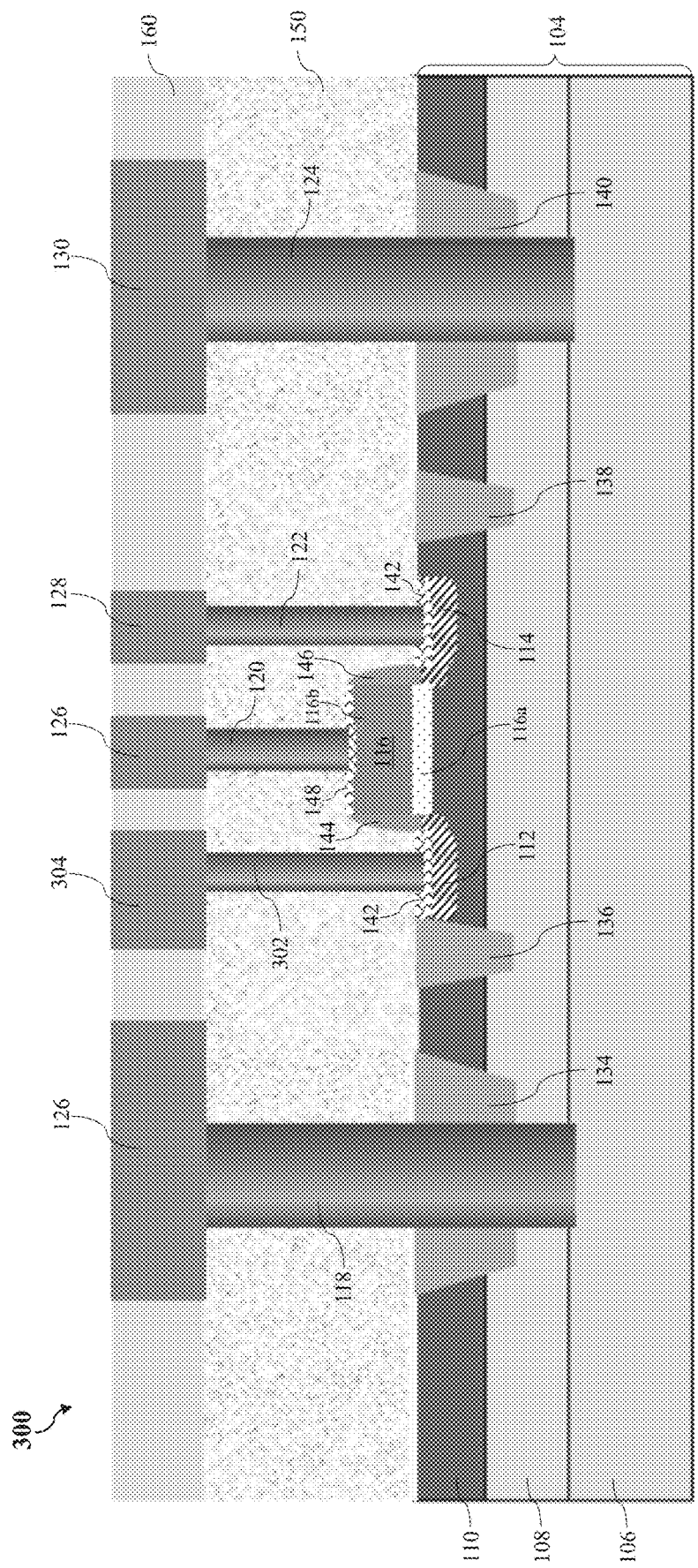
FIG. 3 shows a cross-sectional view of a device according to alternative non-limiting embodiments.

FIG. 3 shows a cross-sectional view of a device 300 according to alternative non-limiting embodiments. The device 300 is similar to the device 100 and thus, the common features are labelled with the same reference numerals and need not be discussed. Note that in the device 300, the first and second conductor elements 118, 120 may also be connected to a common conducting member 126 (similar to the device 100), but the part of the conducting member 126 connecting these conductor elements 118, 120 is not shown in FIG. 3 for simplicity. In various non-limiting embodiments, as compared to the device 100, the device 300 may further include a fifth conductor element 302 arranged to electrically contact the first conductivity region 112. The fifth conductor element 302 may be similar to the third conductor element 122. For example, the fifth conductor element 302 may similarly be arranged at least partially within the first insulating layer 150, spaced apart from the other conductor elements 118, 120, 122, 124. In various non-limiting embodiments, the fifth conductor element 302 may contact the conductive silicide layer 142 to electrically contact the first conductivity region 112. Similar to the third conductor element 122, the fifth conductor element 302 may also be electrically isolated from the first conductor element 118 and the second conductor element 120. For example, the device 100 may further include a fourth conducting member 304 arranged at least partially within the second insulating layer 160, where the fourth conducting member 304 may be spaced apart from the first conducting member 126, the second conducting member 128 and the third conducting member 130. The fifth conductor element 302 may be connected to the fourth conducting member 304, so that the fifth conductor element 302 may be electrically isolated from the rest of the conductor elements 118, 120, 122, 124 via a part of the first insulating layer 150 (between the fifth conductor element 302 and each of the conductor elements 118, 120, 122, 124) and a part of the second insulating layer 160 (between the fourth conducting member 304 and each of the conducting members 126, 128, 130). Further, similar to the third conductor element 122, the fifth conductor element 302 may be a normal contact with a diameter substantially equal to that of the second and third conductor elements 120, 122 and smaller than that of the first and fourth conductor elements 118, 124 in various non-limiting embodiments. In various non-limiting embodiments, a diameter of the fifth conductor element 302 may range from about 0.12 um to about 0.20 um. In various non-limiting embodiments, a diameter of the first conductor element 118 compared to a diameter of the fifth conductor element 302 may have a ratio ranging from about 1.5 to about 2.5. In various non-limiting embodiments, a diameter of the fourth conductor element 124 compared to a diameter of the fifth conductor element 302 may have a ratio ranging from about 1.5 to about 2.5.

In various non-limiting embodiments, the method for forming the device 100 may further include forming the fifth conductor element 302 to electrically contact the first conductivity region 112. Forming the fifth conductor element 302 may include the second mask 208. For example, the second mask 208 may further include a third gap above where the fifth conductor element 302 is to be formed. The third gap may expose portions of the first insulating layer 150 and the silicide layer 142 where the fifth conductor element 302 is to be formed. An opening may be formed for the fifth conductor element 302 with the second mask 208 by for example, etching the first insulating layer 150 and the silicide layer 142 under the third gap of the second mask 208. In various non-limiting embodiments, the opening for the fifth conductor element 302 may be formed simultaneously with the second openings 212, 214 for the second and third conductor elements 120, 122. However, in alternative non-limiting embodiments, the opening for the fifth conductor element 302 and the second openings 212, 214 may be formed sequentially. In various non-limiting embodiments, depositing the conductive material 218 may further include depositing the conductive material 218 into the opening for the fifth conductor element 302. In other words, the fifth conductor element 302 may be formed simultaneously with the second and third conductor elements 120, 122. In various non-limiting embodiments, the method may further include forming the fourth conducting member 304 to connect to the fifth conductor element 302 in a manner similar to forming the second and third conducting members 128, 130 as described above.

In various non-limiting embodiments, a structure may include a plurality of the devices 100 and/or the devices 300. In various non-limiting embodiments, the structure may be a switch structure such as, but not limited to, a RF switch structure. In various non-limiting embodiments, the structure may have a series-shunt-series topology. For example, the structure may include a plurality of series-shunt-series branches, where each branch may include a plurality of the devices 100 and/or the devices 300. For example, the structure may include a double-pole-double-throw (DPDT) switch formed by four series-shunt-series branches, where each branch may include a plurality of the devices 100 and/or the devices 300. However, in alternative non-limiting embodiments, the structure may have a topology different from the series-shunt-series topology. Further, in alternative non-limiting embodiments, the structure may have a different number of poles and throws, and may be formed by a different number and/or type of branches. For example, instead of a DPDT switch, the structure may include a single pole double throw (SPDT) switch or a single pole quadruple throw (SP4T) switch. In various non-limiting embodiments, the structure may include a plurality of switches which may include single pole multiple throw switches (e.g. SPDT switches, SP4T switches), multiple pole multiple throw switches (e.g. DPDT switches) or combinations thereof. For example, the structure may be an amplifier (such as a low noise amplifier or a power amplifier), a communication system or a medical instrument.

Figure 4:
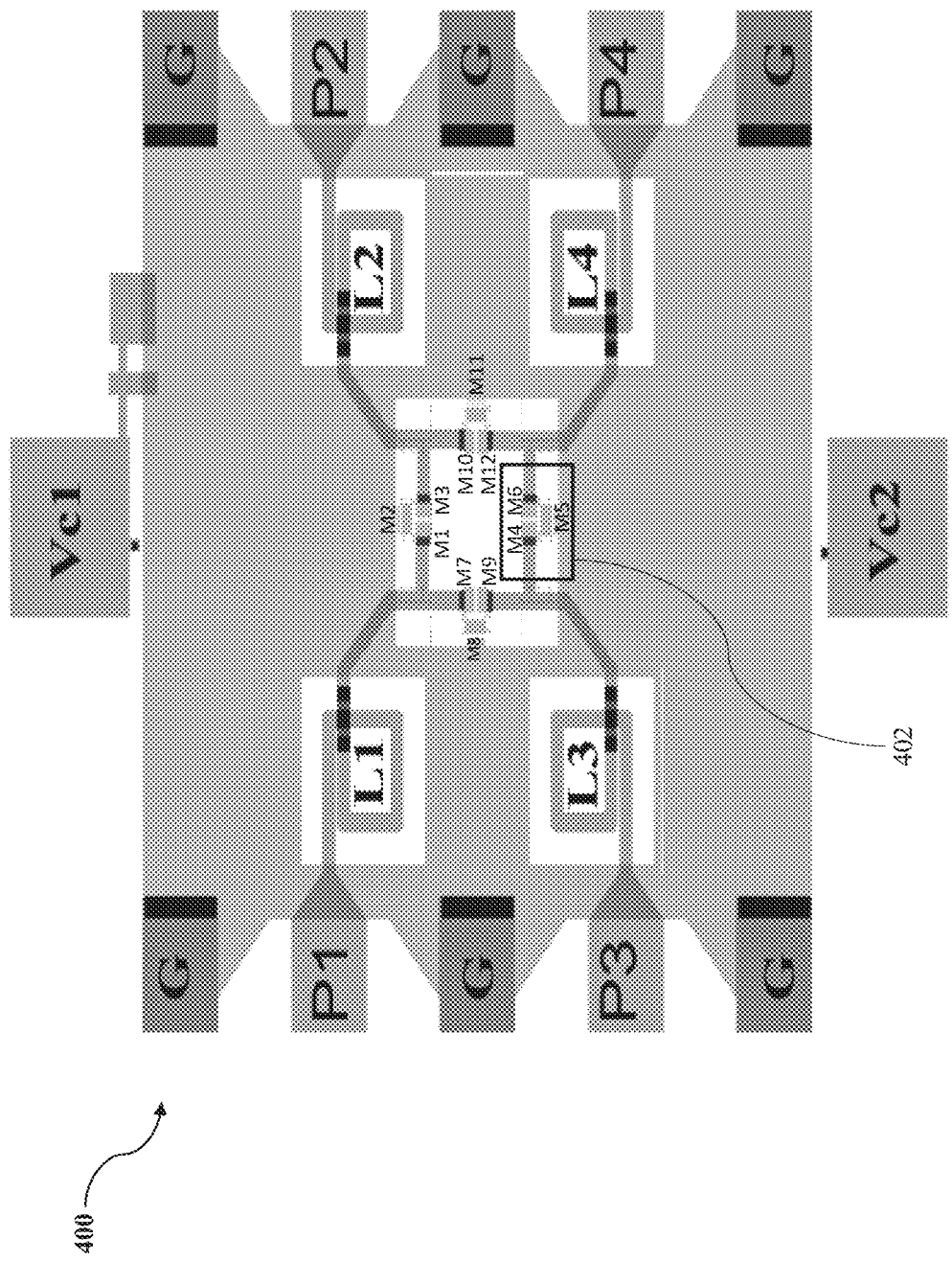
FIG. 4 shows a schematic diagram of a double pole double throw (DPDT) switch including a plurality of devices similar to the device of FIG. 3 according to various non-limiting embodiments.

FIG. 4 shows a schematic diagram of a DPDT switch 400 according to various non-limiting embodiments. As shown in FIG. 4, the DPDT switch 400 may include two input ports P1, P3 and two output ports P2, P4, and may be electrically coupled to voltages Vc1, Vc2 and ground G. The DPDT switch 400 may further include four on chip matching inductors L1-L4, where each matching inductor L1-L4 may be electrically coupled to one of the ports P1-P4. In addition, the DPDT switch 400 may include four series-shunt-series branches electrically coupled to the matching inductors L1-L4. Each branch may include a plurality of devices M1-M12. For example, the branch 402 may include a first series segment comprising the device M4, a second series segment comprising the device M6 and a shunt segment comprising the device M5. Each device M1-M12 may be similar to the device 300.

Figure 5:
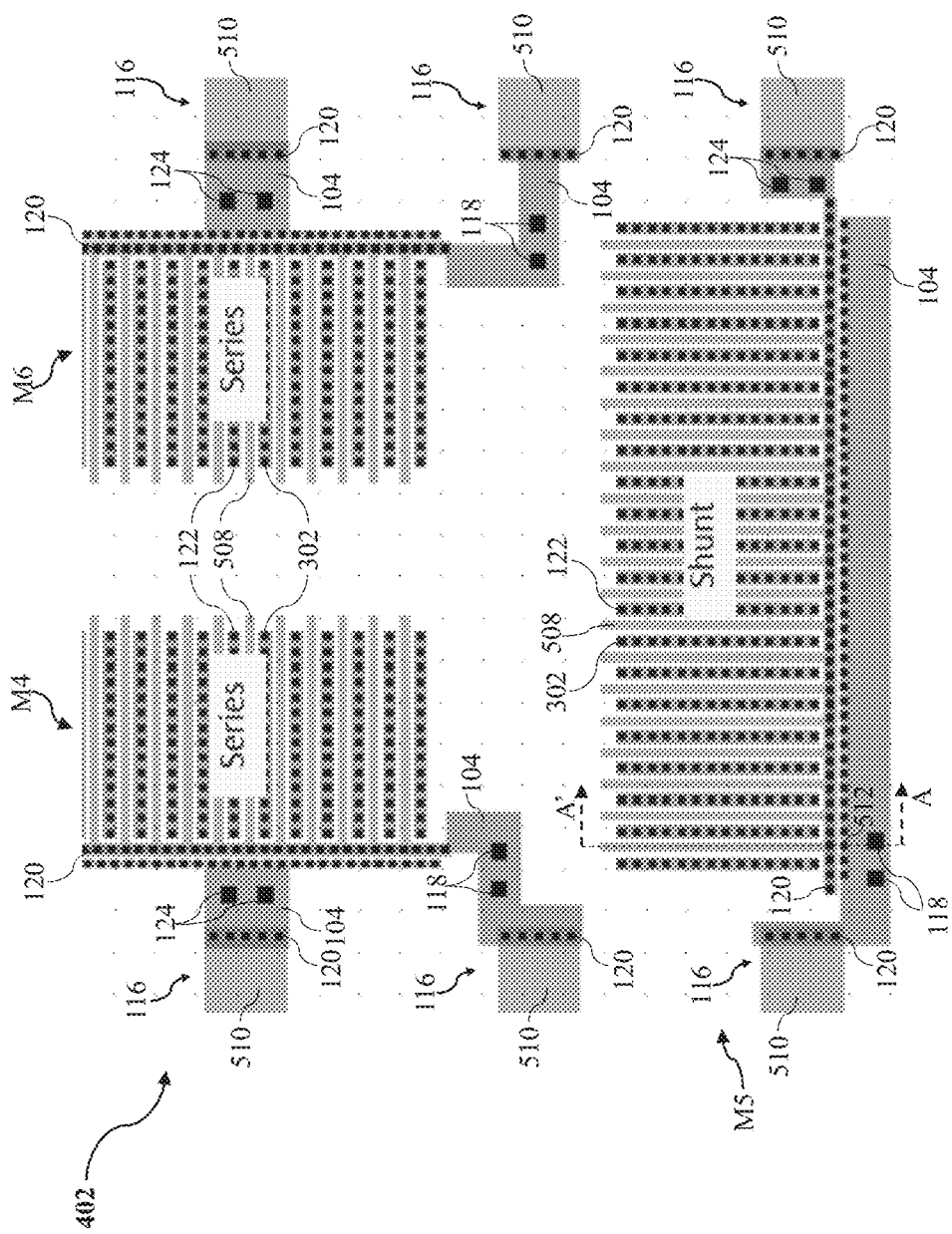
FIG. 5 shows a magnified view of a branch of the DPDT switch of FIG. 4.
Figure 6:
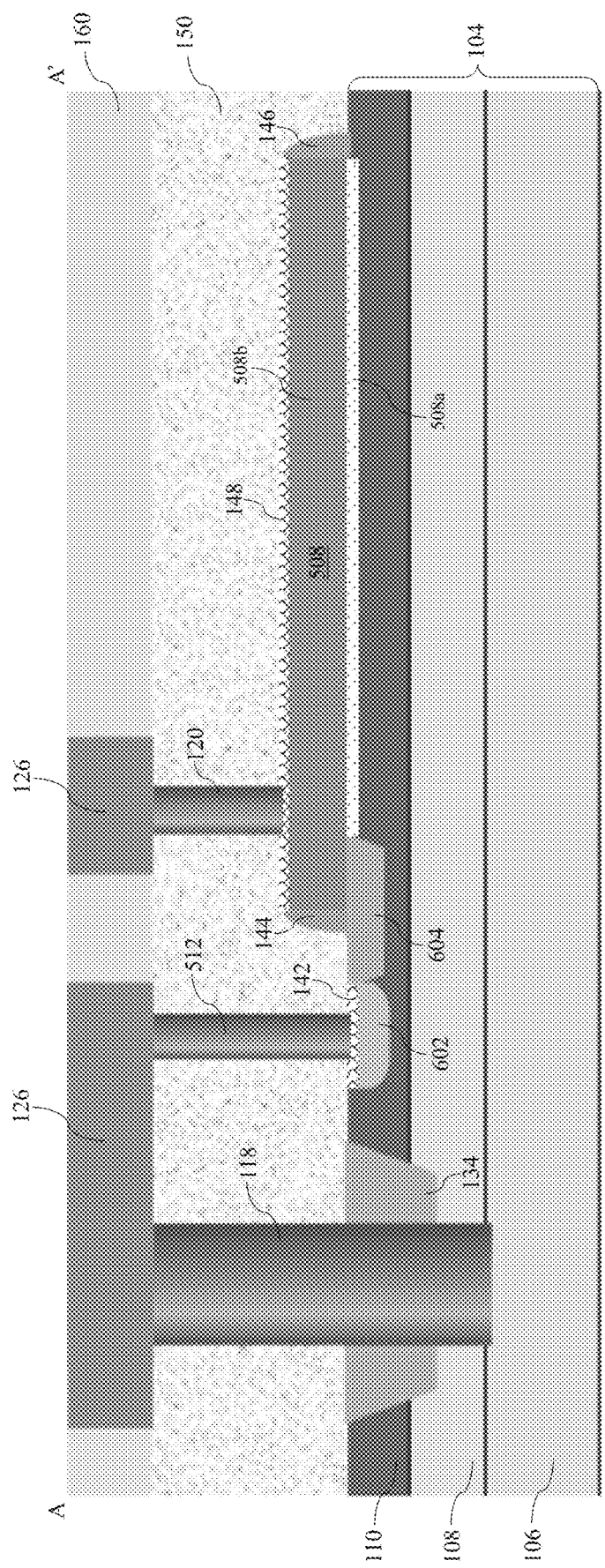
FIG. 6 shows a cross-sectional view of a device of the branch of FIG. 5.

FIG. 5 shows a magnified view of the branch 402 of the DPDT switch 400 according to various non-limiting embodiments. As mentioned above, each device M4, M5, M6 of the branch 402 may be similar to the device 300, and thus, the common features are labelled with the same reference numerals and need not be discussed. FIG. 6 shows a cross-sectional view of the shunt segment comprising the device M5 along the line A-A'.

Referring to FIGS. 5 and 6, in various non-limiting embodiments, the gate structure 116 of each device M4, M5, M6 may include a base portion 510 and a plurality of gate fingers 508 extending from the base portion 510 and arranged parallel to one another over the SOI structure 104. As shown in FIG. 6, each gate finger 508 may include a gate oxide layer 508a and a gate element 508b similar to the gate oxide layer 116a and the gate element 116b of the gate structure 116 of the device 100/300. The gate fingers 508 of the series segments comprising the devices M4, M6 may be substantially perpendicular to the gate fingers 508 of the shunt segment comprising the device M5. In various non-limiting embodiments, for each segment comprising the devices M4, M5, M6, a plurality of first conductivity regions 112 (not shown in FIG. 5) may be arranged at least partially within the semiconductor layer 110 of the SOI structure 104 along one side of each gate finger 508, and a plurality of second conductivity regions 114 (not shown in FIG. 5) may be arranged at least partially within the semiconductor layer 110 of the SOI structure 104 along the other side of the gate finger 508. A plurality of fifth conductor elements 302 may be arranged along one side of each gate finger 508 to electrically contact respective first conductivity regions 112 and a plurality of third conductor elements 122 may be arranged along the other side of the gate finger 508 to electrically contact respective second conductivity regions 114. As shown in FIG. 5, the branch 402 may further include a plurality of first conductor elements 118 and fourth conductor elements 124 connected to the SOI structure 104.

Referring to FIGS. 5 and 6, the branch 402 may also include a plurality of third conductivity regions 602 arranged at least partially within the semiconductor layer 110 of the SOI structure 104 and a plurality of sixth conductor elements 512 arranged to electrically contact respective third conductivity regions 602. In various non-limiting embodiments, the third conductivity regions 602 may serve as body contacts of the SOI structure 104 to connect the SOI structure 104 to an external voltage. A silicide layer 142 may be arranged over each third conductivity region 602. Each third conductivity region 602 may include one or more p-type dopants or one or more n-type dopants. The sixth conductor elements 512 may be connected to the first conducting member 126. In other words, the sixth conductor elements 512 may be electrically coupled with the first and second conductor elements 118, 120 (in FIG. 6, the part of the conducting member 126 connecting the first and second conductor elements 118, 120 is again not shown for simplicity). A fifth isolation region 604 may be arranged between the gate oxide layer 508a and the third conductivity region 602.

In various non-limiting embodiments, the first conducting member 126 and the third conducting member 130 of the device 100 may be connected to ground to discharge the charge carriers in the substrate 106. Further, the first conductor element 118, the second conductor element 120 and the first conducting member 126 of the device 100 may form a conducting path between the substrate 106 and the gate structure 116, to discharge the charge carriers in the substrate 106. Thus, a structure including the device 100, the device 300 or devices similar to the devices 100, 300, such as the structure described with reference to FIGS. 4-6 may have improved linearity and power handling capabilities over a wide frequency range.

Figure 7:
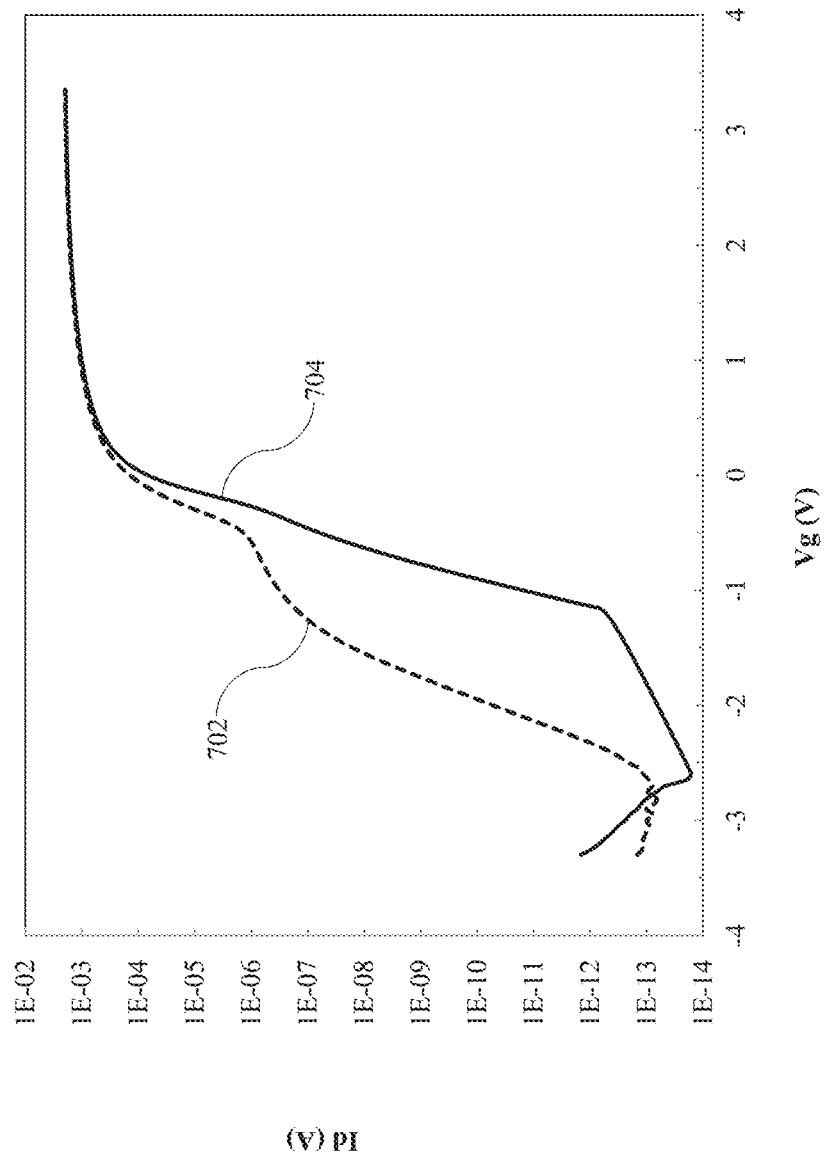
FIG. 7 shows current-voltage plots of a prior art switch structure and a switch structure including a plurality of the devices of FIG. 1.
Figure 8:
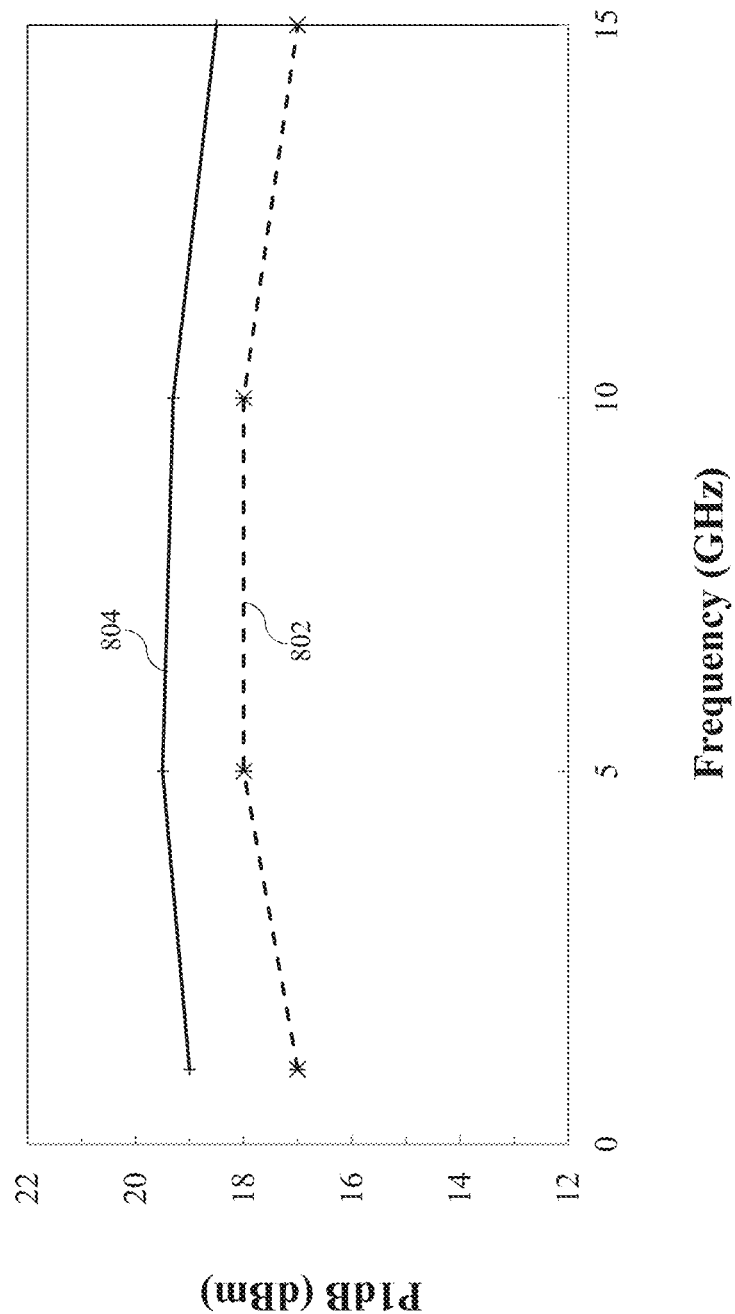
FIG. 8 shows plots representing the output power at 1 dB compression of a prior art switch structure and a switch structure including a plurality of the devices of FIG. 1.
Figure 9B:
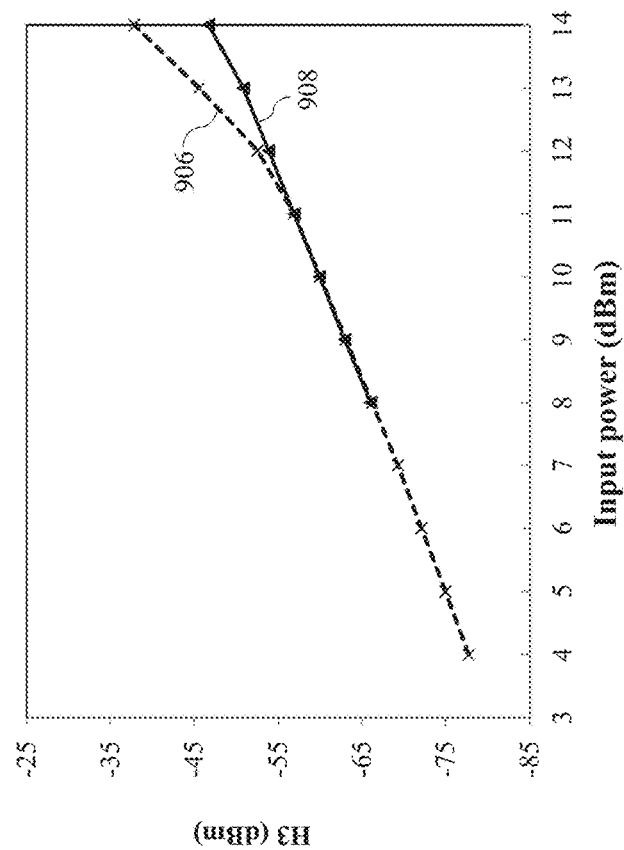
FIG. 9B shows plots representing the third harmonics of a prior art switch structure and a switch structure including a plurality of the devices of FIG. 1.
Figure 9A:
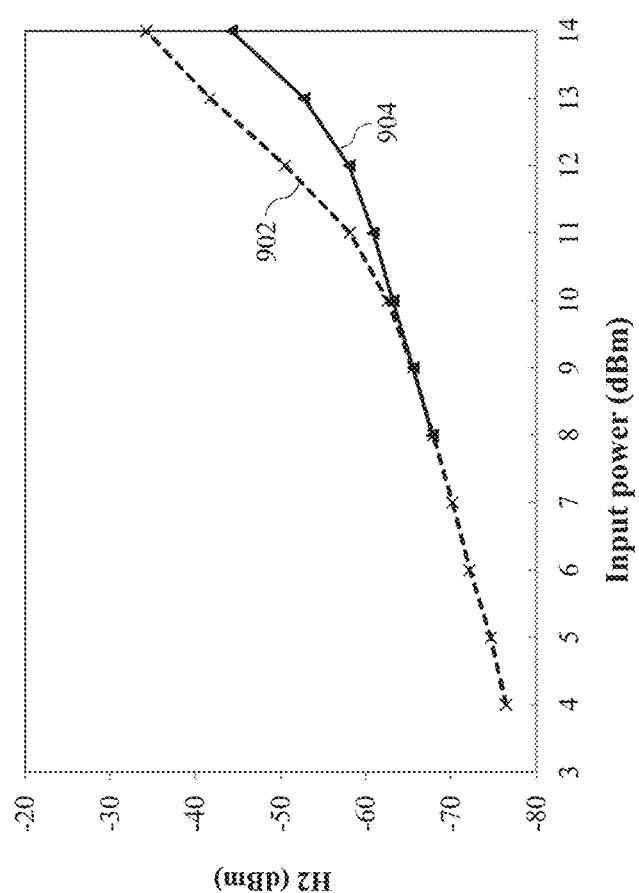
FIG. 9A shows plots representing the second harmonics of a prior art switch structure and a switch structure including a plurality of the devices of FIG. 1.

FIGS. 7, 8, and 9A-9B show plots representing example characteristics of a prior art switch structure and a switch structure including the devices 100. The prior art switch structure is similar to the switch structure including the devices 100, except that the prior art switch structure does not include the first and fourth conductor elements 118, 124. Further, the lengths of both the prior art switch structure and the switch structure including the devices 100 may be about 0.2 um. In particular, FIG. 7 shows current-voltage (Id-Vg) plots 702, 704 of the prior art switch structure and the switch structure including the devices 100 respectively. As shown in FIG. 6, with the first and fourth conductor elements 118, 124, the leakage current of the switch structure including the devices 100 may be lower than the leakage current of the prior art switch structure. FIG. 8 shows plots 802, 804 representing the P1 dB (output power at 1 dB compression or said differently, 1 dB compression point) at different frequencies of the prior art switch structure and the switch structure including the devices 100, respectively. As shown in FIG. 8, the P1 dB of the switch structure including the devices 100 may be about 2 dB higher than the P1 dB of the prior art switch structure across a wide range of frequencies from 1 GHz to 15 GHz. FIG. 9A shows plots 902, 904 representing the second harmonics of the prior art switch structure and the switch structure including the devices 100 respectively, at different levels of input power. FIG. 9B shows plots 906, 908 representing the third harmonics of the prior art switch structure and the switch structure including the devices 100 respectively, at different levels of input power. As shown in FIGS. 9A and 9B, there is a lower amount of harmonic distortion in the switch structure including the devices 100 as compared to the prior art switch structure.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:
1. A device comprising:
 a semiconductor-on-insulator (SOI) structure comprising a substrate, an insulator layer over the substrate, and a semiconductor layer over the insulator layer, wherein the semiconductor layer comprises a first conductivity region, a second conductivity region and an isolation region at least partially arranged within the semiconductor layer, wherein the isolation region extends at least partially into the insulator layer;
 a gate structure arranged over the semiconductor layer and between the first conductivity region and the second conductivity region;
 a first conductor element arranged through the semiconductor layer and the insulator layer of the SOI structure to electrically contact the substrate, wherein the first conductor element is arranged through the isolation region;
 a second conductor element arranged to electrically contact the gate structure; and
 a conducting member connecting the first conductor element and the second conductor element to electrically couple the first conductor element and the second conductor element.

2. The device according to claim 1, wherein a diameter of the first conductor element is greater than a diameter of the second conductor element.

3. The device according to claim 1, further comprising a third conductor element arranged to electrically contact the second conductivity region; and wherein the third conductor element is electrically isolated from the first conductor element and the second conductor element.

4. The device according to claim 3, further comprising a fourth conductor element arranged through the semiconductor layer and the insulator layer of the SOI structure to electrically contact the substrate, wherein the fourth conductor element is electrically isolated from the first conductor element and the second conductor element.

5. The device according to claim 4, wherein the fourth conductor element is electrically isolated from the third conductor element.

6. The device according to claim 3, wherein the conducting member is a first conducting member and the device further comprises a second conducting member connected to the third conductor element, and wherein an insulating material is arranged between the first conducting member and the second conducting member.

7. The device according to claim 1, further comprising a fifth conductor element arranged to electrically contact the first conductivity region; and wherein the fifth conductor element is electrically isolated from the first conductor element and the second conductor element.

8. The device according to claim 1, wherein the device is a RF switch transistor, a single pole multiple throw switch or a multiple pole multiple throw switch.

9. The device according to claim 1, wherein the isolation region is a first isolation region and wherein the device further comprises a second isolation region at least partially within the semiconductor layer and laterally between the first isolation region and the first conductivity region.

10. The device according to claim 9, wherein the second isolation region extends at least partially into the insulator layer.

11. A structure comprising a plurality of devices, wherein one or more of the devices comprises:
a semiconductor-on-insulator (SOI) structure comprising a substrate, an insulator layer over the substrate, and a semiconductor layer over the insulator layer, wherein the semiconductor layer comprises a first conductivity region, a second conductivity region and an isolation region at least partially arranged within the semiconductor layer, wherein the isolation region extends at least partially into the insulator layer;
a gate structure arranged over the semiconductor layer and between the first conductivity region and the second conductivity region;
a first conductor element arranged through the semiconductor layer and the insulator layer of the SOI structure to electrically contact the substrate, wherein the first conductor element is arranged through the isolation region;
a second conductor element arranged to electrically contact the gate structure; and
a conducting member connecting the first conductor element and the second conductor element to electrically couple the first conductor element and the second conductor element.

12. The structure according to claim 11, wherein the one or more of the devices comprises a RF switch transistor, a single pole multiple throw switch, a multiple pole multiple throw switch or combinations thereof.

13. A method comprising:
providing a semiconductor-on-insulator (SOI) structure comprising a substrate, an insulator layer over the substrate, and a semiconductor layer over the insulator layer, wherein the semiconductor layer comprises a first conductivity region, a second conductivity region and an isolation region at least partially arranged within the semiconductor layer, wherein the isolation region extends at least partially into the insulator layer;
forming a gate structure, wherein the gate structure is arranged over the semiconductor layer and between the first conductivity region and the second conductivity region;
forming a first conductor element, wherein the first conductor element is arranged through the semiconductor layer and the insulator layer of the SOI structure to electrically contact the substrate, wherein the first conductor element is arranged through the isolation region;
forming a second conductor element to electrically contact the gate structure; and
forming a conducting member, wherein the conducting member connects the first conductor element and the second conductor element to electrically couple the first conductor element and the second conductor element.

14. The method according to claim 13, wherein a diameter of the first conductor element is greater than a diameter of the second conductor element.

15. The method according to claim 13, wherein forming the first conductor element comprises a first mask and forming the second conductor element comprises a second mask, and wherein the first mask is different from the second mask.

16. The method according to claim 15, wherein forming the first conductor element and the second conductor element comprises:
forming a first opening for the first conductor element with the first mask; and
forming a second opening for the second conductor element with the second mask, and
depositing conductive material into the first opening and the second opening simultaneously to form the first conductor element and the second conductor element, respectively.

17. The method according to claim 16, wherein the method further comprises:
forming an insulating layer over the semiconductor layer such that the gate structure is arranged at least partially within the insulating layer;
forming the first mask by depositing a first mask material over the insulating layer; and
forming the second mask by depositing a second mask material over the insulating layer and into the first opening.

18. The method according to claim 13, further comprising forming a third conductor element to electrically contact the second conductivity region, and wherein the third conductor element is electrically isolated from the first conductor element and the second conductor element.

19. The method according to claim 13, further comprising forming a fourth conductor element through the semiconductor layer and the insulator layer of the SOI structure to electrically contact the substrate, wherein the fourth conductor element is electrically isolated from the first conductor element and the second conductor element.

20. The method according to claim 13, further comprising forming a fifth conductor element to electrically contact the first conductivity region, wherein the fifth conductor element is electrically isolated from the first conductor element and the second conductor element.

* * * * *